United States Patent
Senoo

(10) Patent No.: US 9,530,836 B2
(45) Date of Patent: Dec. 27, 2016

(54) SEMICONDUCTOR APPARATUS

(71) Applicant: TOYOTA JIDOSHA KABUSHIKI KAISHA, Toyota-shi, Aichi-ken (JP)

(72) Inventor: Masaru Senoo, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/087,230

(22) Filed: Mar. 31, 2016

(65) Prior Publication Data

US 2016/0351657 A1    Dec. 1, 2016

(30) Foreign Application Priority Data

May 27, 2015   (JP) ................. 2015-107641

(51) Int. Cl.
*H01L 29/06*   (2006.01)
*H01L 29/40*   (2006.01)

(52) U.S. Cl.
CPC ....... *H01L 29/0623* (2013.01); *H01L 29/0696* (2013.01); *H01L 29/404* (2013.01)

(58) Field of Classification Search
CPC .................... H01L 29/7395; H01L 29/0696
See application file for complete search history.

(56) References Cited

U.S. PATENT DOCUMENTS

| | | |
|---|---|---|
| 2008/0169526 A1 | 7/2008 | Wakimoto et al. |
| 2015/0054118 A1 | 2/2015 | Senoo |
| 2015/0171199 A1* | 6/2015 | Senoo ................. H01L 29/7397 257/140 |

FOREIGN PATENT DOCUMENTS

| | | |
|---|---|---|
| JP | H08-78661 A | 3/1996 |
| JP | 2008-193043 A | 8/2008 |
| WO | 2013/140572 A1 | 9/2013 |

* cited by examiner

Primary Examiner — Marc Armand
(74) Attorney, Agent, or Firm — Oliff PLC

(57) ABSTRACT

A semiconductor apparatus includes a semiconductor substrate including a device region and a peripheral region. The peripheral region includes guard rings. A first peripheral insulating film, first peripheral conducting films, a second peripheral insulating film and second peripheral conducting films are laminated in the peripheral region. Each of the first peripheral conducting films extends annularly. Each of the second peripheral conducting films overlaps a part of the corresponding first peripheral conducting film. Each of the second peripheral conducting films is connected to the corresponding first peripheral conducting film via a first contact hole. Each of the second peripheral conducting films is connected to the corresponding guard ring via a second contact hole. A center of at least one of the second contact holes is located on inner side with respect to a center line of the guard ring in a width direction.

5 Claims, 11 Drawing Sheets

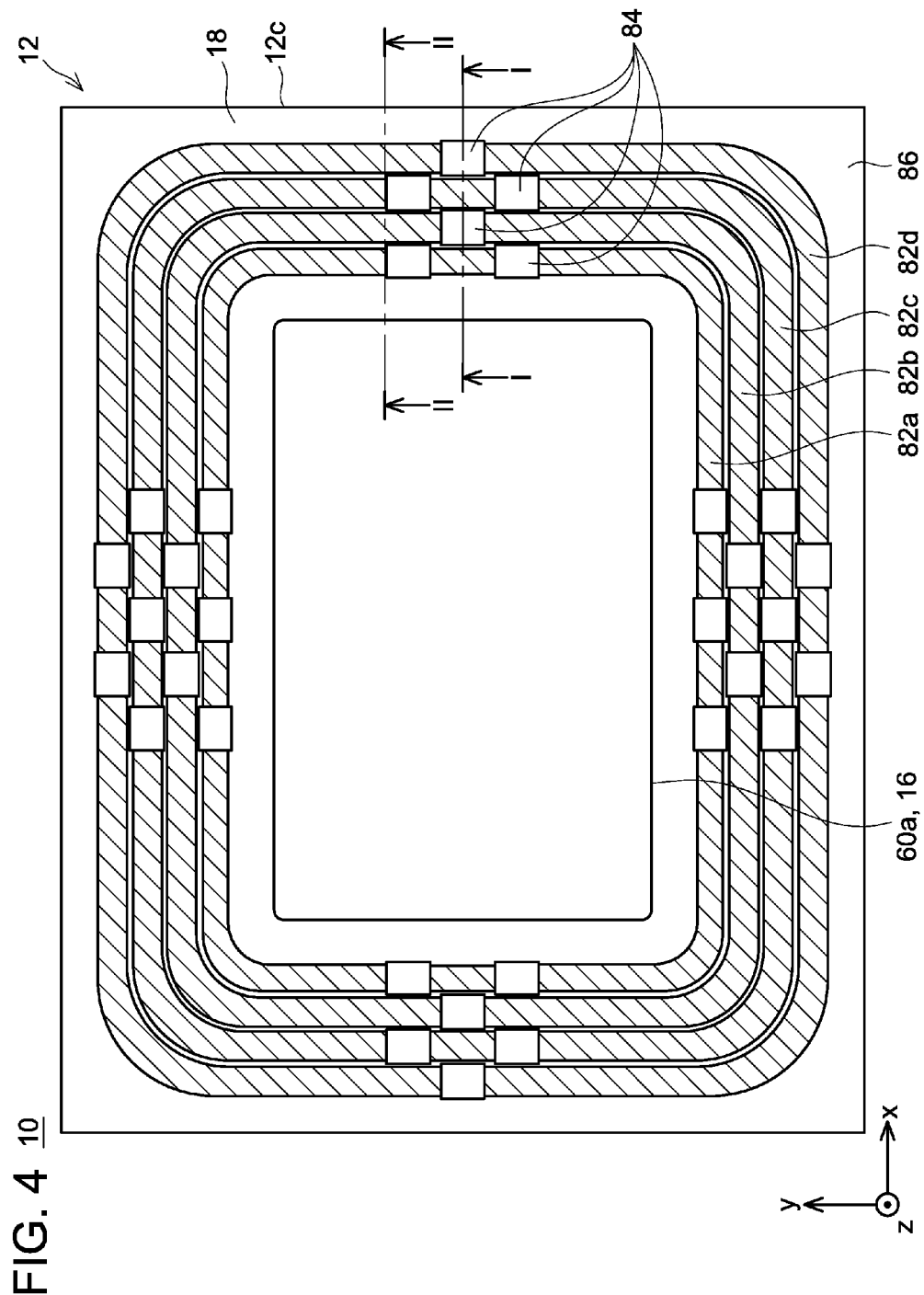

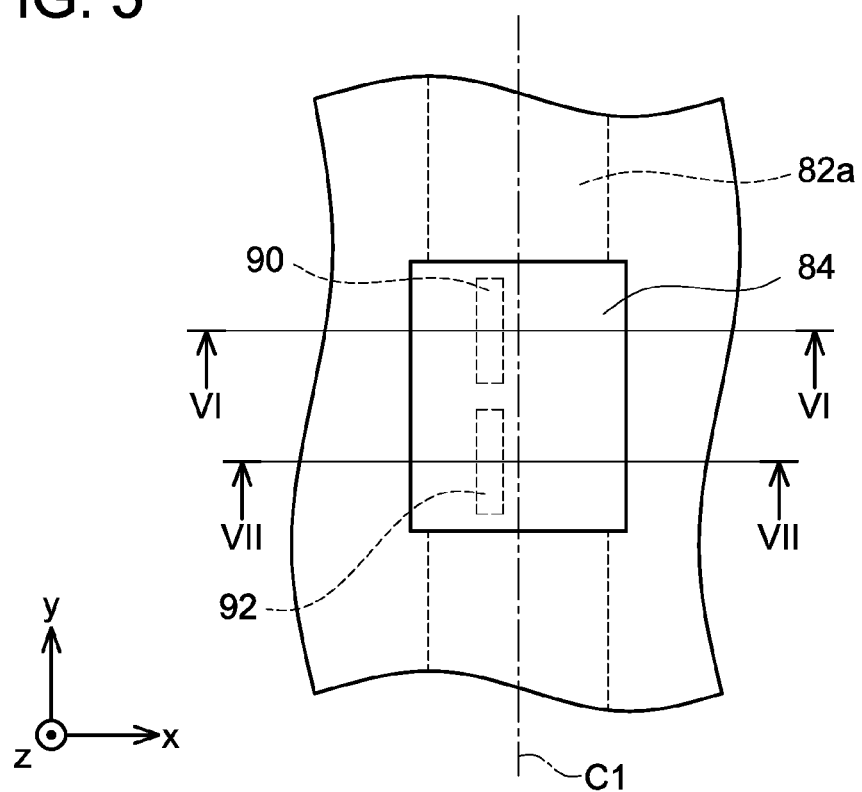

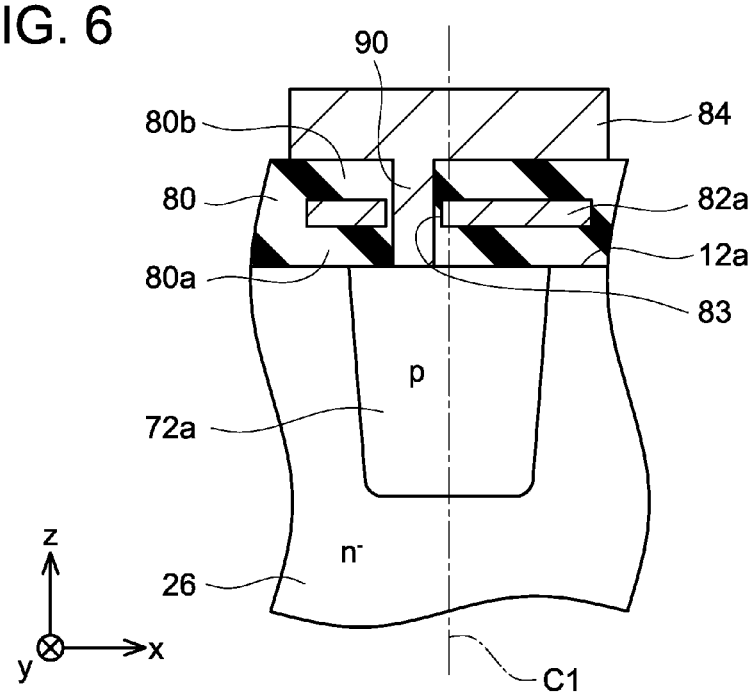
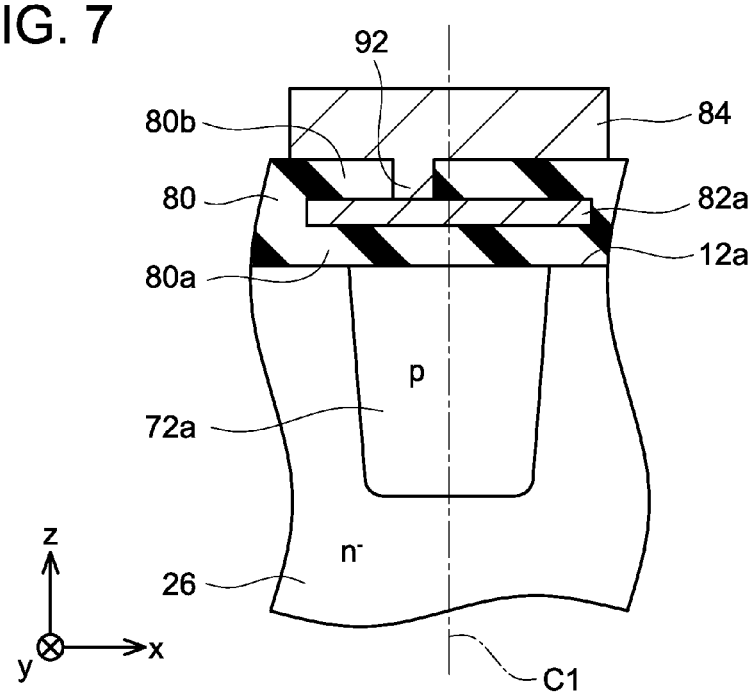

SEMICONDUCTOR APPARATUS

CROSS-REFERENCE TO RELATED APPLICATION

This application claims priority to Japanese Patent Application No. 2015-107641 filed on May 27, 2015, the contents of which are hereby incorporated by reference into the present application.

TECHNICAL FIELD

The technique disclosed herein relates to a semiconductor apparatus.

BACKGROUND ART

WO 2013/140572 A1 discloses a semiconductor apparatus provided with a plurality of guard rings surrounding a device region where an IGBT (Insulated Gate Bipolar Transistor) is formed. Each guard ring is configured of a p-type region provided in an n-type semiconductor substrate, and is provided at a position exposed in a front surface of the semiconductor substrate. Each guard ring extends in an annular shape surrounding the device region, and the plurality of guard rings surrounds the device region in multiple layers. Further, the semiconductor apparatus includes first peripheral conducting films and second peripheral conducting films. The first peripheral conducting films are provided for each of the guard rings, and each first peripheral conducting film is arranged on the corresponding guard ring via an insulating film. Each first peripheral conducting film extends in an annular shape along the corresponding guard ring, and adjacent first peripheral conducting films are insulated from each other. The second peripheral conducting films are provided for each of the guard rings, and each second peripheral conducting film is arranged on the corresponding first peripheral conducting film via an insulating film. Some of the second peripheral conducting films are provided only at partial positions in a circumferential direction of the first peripheral conducting films. The first peripheral conducting films and the second peripheral conducting films are connected to each other via contact holes provided in the insulating films separating the first peripheral conducting films and the second peripheral conducting films. Further, the second peripheral conducting films and the guard rings are connected to each other by contact holes that penetrate all of the insulating films separating the first peripheral conducting films and the second peripheral conducting films, the first peripheral conducting films themselves, and the insulating films separating the first peripheral conducting films and the guard rings. The second peripheral conducting films are provided to connect the guard ring and the first peripheral conducting film. The first peripheral conducting films function as shielding films suppressing influences of external charges. That is, since a peripheral region is shielded by the first peripheral conducting films, an electric field distribution in the peripheral region is suppressed from being disturbed by an electric field generated by the external charges when the external charges adhere to a front surface of the semiconductor apparatus. A thickness of the second peripheral conducting films is thicker than a thickness of the first peripheral conducting films. A conductive material can be filled in the two types of contact holes upon formation of the thick second peripheral conducting films.

The first peripheral conducting films can be formed accurately due to its thickness being thin. Accordingly, a clearance between the first peripheral conducting films can be made short. By making the clearance between the first peripheral conducting films short, a clearance between the guard rings can be made short as well. On the other hand, the thick second peripheral conducting films have less processing accuracy, so a clearance between the second peripheral conducting films cannot be made short. However, since the second peripheral conducting films are provided at partial positions in the circumferential direction of the first peripheral conducting films, a plurality of second peripheral conducting films can be arranged dispersed in the circumferential direction of the first peripheral conducting films. Accordingly, even if the clearance between the first peripheral conducting film is made short, the second peripheral conducting films are prevented from interfering with each other. By a structure that causes the thin first peripheral conducting films to be electrically connected to the guard rings via the thick second peripheral conducting films, the clearance between the guard rings can be made short without allowing the second peripheral conducting films interfere with each other. Thus, according to this structure, the peripheral region can be made small, and a size of the semiconductor apparatus can be reduced. In the technique of WO 2013/140572 A1, the contact holes connecting the second peripheral conducting films and the guard rings are provided on center lines of the guard rings in a width direction.

SUMMARY

In the semiconductor apparatus of WO 2013/140572 A1, there are contact holes for connecting the second peripheral conducting films and the guard rings. The contact holes are provided locally on the guard rings. Due to the local presences of the contact holes, an electric field is likely to concentrate in the n-type semiconductor region adjacent to the p-type guard rings located in the vicinities of the contact holes, and a high electric field may be generated in such a region. The description herein provides a technique that can suppress a generation of a local high electric field in the vicinity of a contact hole connecting a second peripheral conducting film and a guard ring, in a semiconductor apparatus inducing a first peripheral conducting film and the second peripheral conducting film.

A semiconductor apparatus disclosed herein comprises a semiconductor substrate, a front electrode being in contact with a front surface of the semiconductor substrate, a rear electrode being in contact with a rear surface of the semiconductor substrate, a first peripheral insulating film, a plurality of first peripheral conducting films, a second peripheral insulating film; and a plurality of second peripheral conducting films. The semiconductor substrate comprises a device region and a peripheral region. In a plan view along a thickness direction of the semiconductor substrate, the device region overlaps a contact face between the front electrode and the semiconductor substrate, and the peripheral region is located around the device region. The device region comprises a semiconductor device configured to pass electric current between the front electrode and the rear electrode. The peripheral region comprises a plurality of guard rings of a p-type, exposed in the front surface, and having an annular shape surrounding the device region, and a drift region of an n-type and separating the guard rings from each other. The first peripheral insulating film is located on the front surface in the peripheral region. Each of the first peripheral conducting films is located on the first peripheral insulating film, and having an annular shape overlapping the corresponding guard ring in the plan view along the thickness direction. The second peripheral insulating film is located on each of the first peripheral conducting films. Each of the second peripheral conducting films is located on the second peripheral insulating film, located so as to overlap a part of the corresponding first peripheral conducting film in the plan view along the thickness direction, and has a thickness greater than a thickness of each of the first peripheral conducting films. Each of the second peripheral conducting films is connected to the corresponding first peripheral conducting film via a first contact hole. Each of the second peripheral conducting films is connected to the corresponding guard ring via a second contact hole. A center of at least one of the second contact holes is located on an inner side with respect to a center line of the guard ring connected to the at least one second contact hole. The center line defines a center of the guard ring in a width direction.

Notably, in this description, an "inner side" means a side closer to the device region, and an "outer side" means a side farther away from the device region.

In this semiconductor apparatus, a center of at least one second contact hole is positioned on the inner side than the center line of the corresponding guard ring in the width direction. Accordingly, this second contact hole primarily influences an electric field in the drift region adjacent to the guard ring on the inner side but hardly influences an electric field in the drift region adjacent to the guard ring on the outer side. The electric field generated in the drift region adjacent to the guard ring on the inner side becomes lower than the electric field generated in the drift region adjacent to the guard ring on the outer side. Since the electric field generated in the drift region adjacent to the guard ring on the inner side is low, an electric field that is so high would not be generated even if this region is influenced by the second contact hole. Further, since the influence of the second contact hole hardly affects the drift region adjacent to the guard ring on the outer side, an electric field that is so high would not be generated in this region as well. Accordingly, in this semiconductor apparatus, the generation of the high electric field by the influence of the second contact hole is suppressed.

BRIEF DESCRIPTION OF DRAWINGS

FIG. 4 is a plan view of the semiconductor apparatus showing an arrangement of first field plates 82 and second field plates 84 (showing the first field plates 82 by hatched lines);

FIG. 5 is an enlarged plan view of a second field plate 84;

FIG. 6 is a vertical cross sectional view along a line VI-VI in FIG. 5;

FIG. 7 is a vertical cross sectional view along a line VII-VII in FIG. 5;

DETAILED DESCRIPTION

Figure 1:
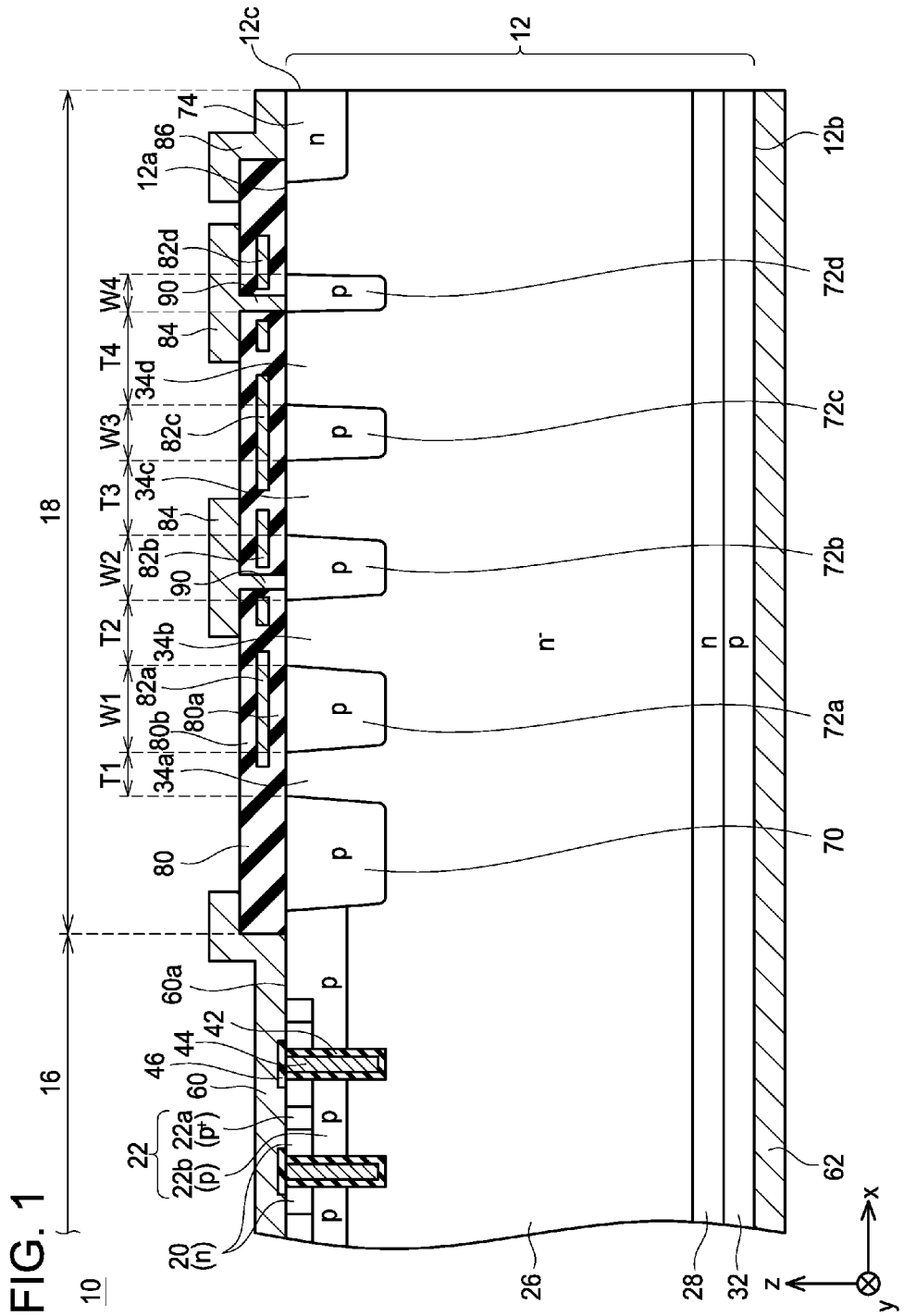
FIG. 1 is a vertical cross sectional view of a semiconductor apparatus (a vertical cross sectional view along a line I-I in FIGS. 3, 4)
Figure 2:
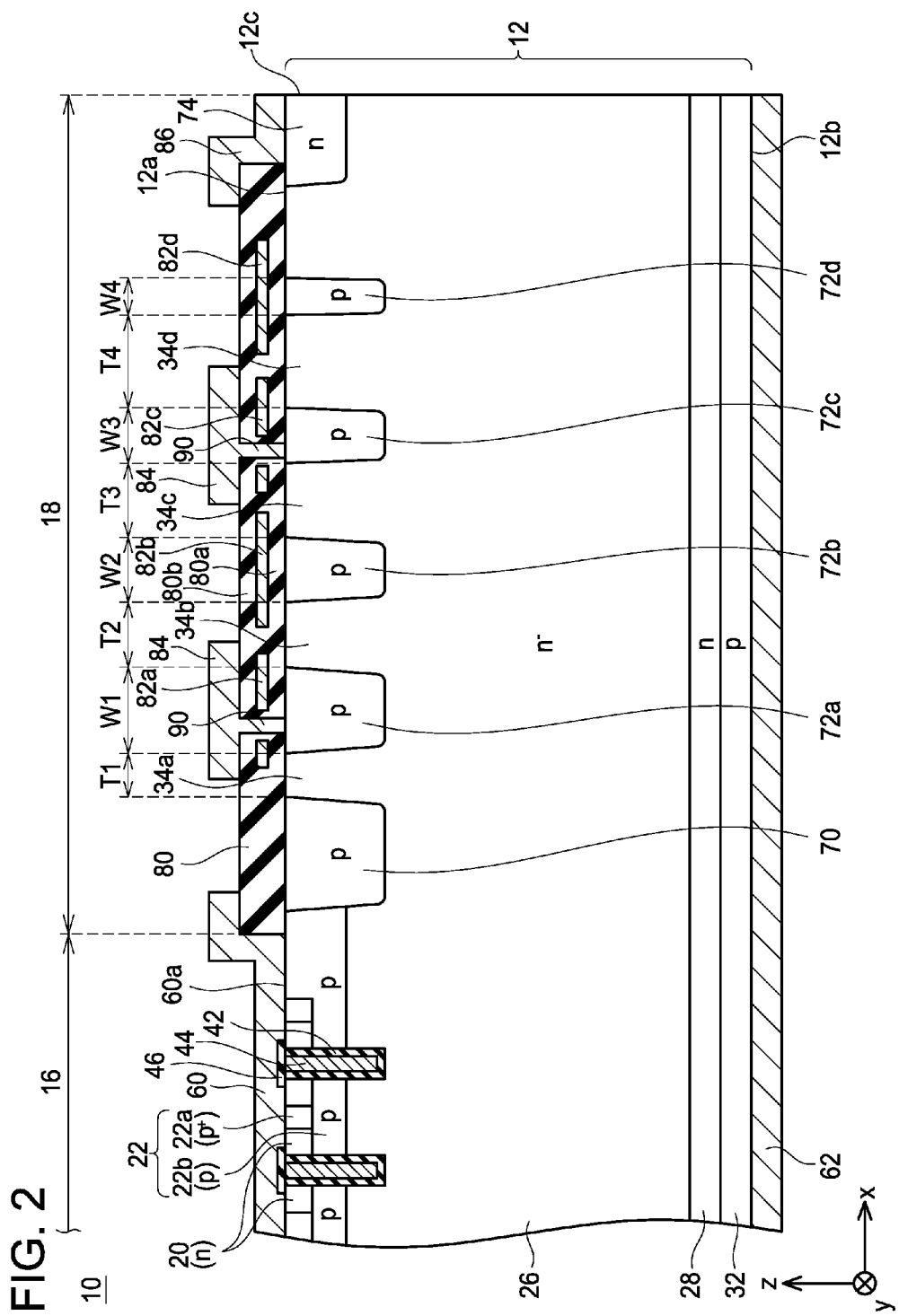
FIG. 2 is a vertical cross sectional view of the semiconductor apparatus (a vertical cross sectional view along a line II-II in FIGS. 3, 4)

A semiconductor apparatus 10 shown in FIGS. 1, 2 includes a semiconductor substrate 12 configured by silicon. Notably, hereinbelow, one direction parallel to a front surface 12a of the semiconductor substrate 12 (left and right direction of FIG. 1) will be termed an x direction. Further, a direction that is parallel to the front surface 12a of the semiconductor substrate 12 and orthogonal to the x direction (direction vertical to a sheet surface of FIG. 1) will be termed a y direction. Further, a thickness direction of the semiconductor substrate 12 (up and down direction of FIG. 1) will be termed a z direction.

Figure 3:
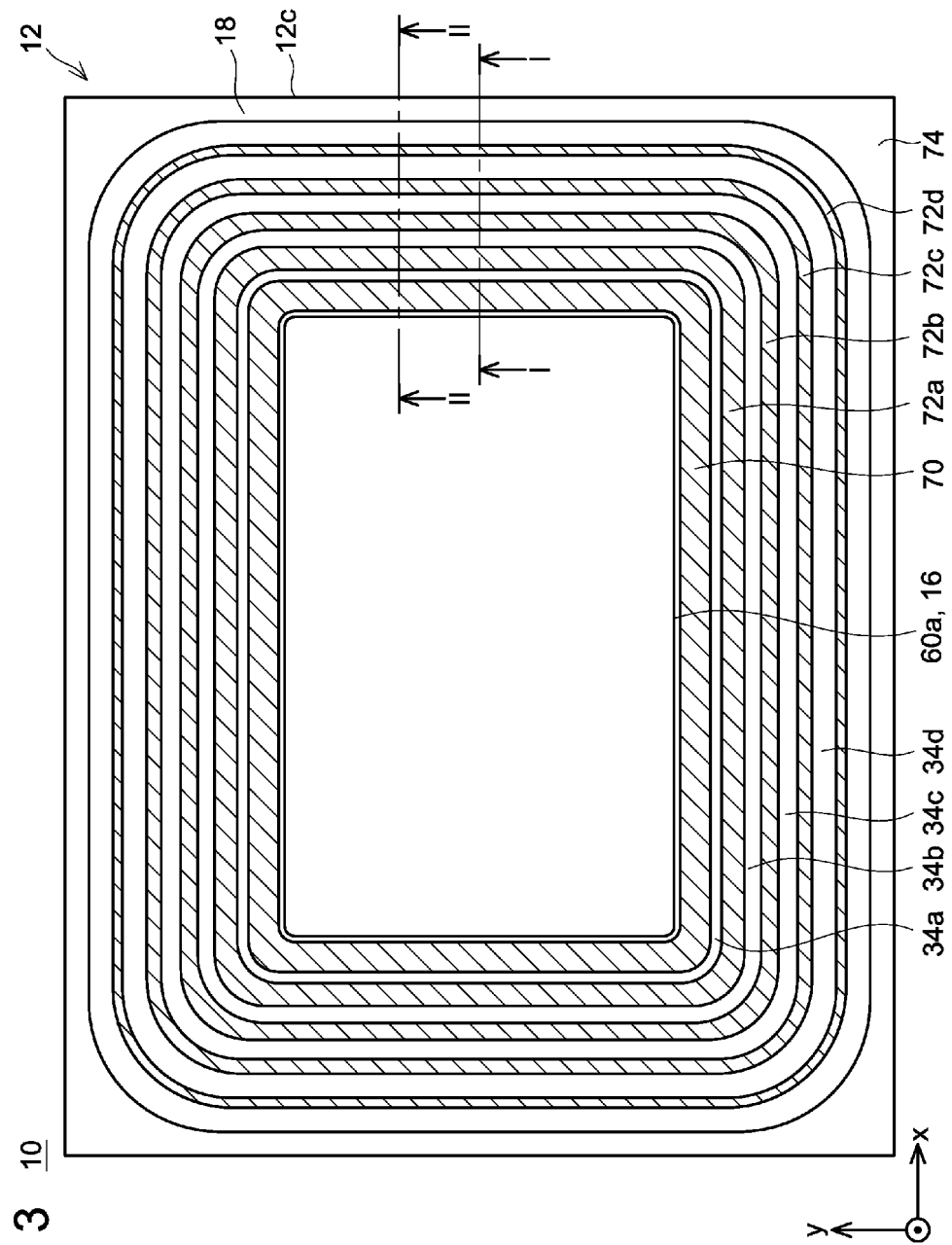
FIG. 3 is a plan view of the semiconductor apparatus showing an arrangement of a separating region 70 and guard rings 72 (showing the separating region 70 and the guard rings 72 by hatched lines)

A front electrode 60 is provided on the front surface 12a of the semiconductor substrate 12. The front electrode 60 makes contact with the front surface 12a. The front electrode 60 is provided substantially at a center of the front surface 12a of the semiconductor substrate 12. Thus, as shown in FIGS. 3, 4, a contact surface 60a between the semiconductor substrate 12 and the front electrode 60 is located substantially at the center of the front surface 12a. Hereinbelow, a region of the semiconductor substrate 12 that overlaps the contact surface 60a when the front surface 12a is seen in a plan view will be termed a device region 16. Further, a region of the semiconductor substrate 12 that is arranged around the device region 16 when the front surface 12a is seen in the plan view will be termed a peripheral region 18. That is, a region between the device region 16 and an end surface 12c of the semiconductor substrate 12 is called the peripheral region 18.

As shown in FIGS. 1 and 2, a rear electrode 62 is provided on a rear surface 12b of the semiconductor substrate 12. The rear electrode 62 is provided substantially over an entire region of the rear surface 12b. That is, the rear electrode 62 is in contact with the device region 16 and the peripheral region 18.

A plurality of trenches is provided on the front surface 12a of the semiconductor substrate 12 in the device region 16. The trenches extend parallel to each other in the y direction. An inner surface of each trench is covered by a gate insulating film 42. A gate electrode 44 is arranged in each trench. The gate electrodes 44 are insulated from the semiconductor substrate 12 by the gate insulating films 42. A front surface of each gate electrode 44 is covered by an interlayer insulating film 46.

Emitter regions 20, a body region 22, a drift region 26, a buffer region 28, and a collector region 32 are provided in the device region 16.

The emitter regions 20 are n-type regions, and are exposed in the front surface 12a of the semiconductor substrate 12. The emitter regions 20 make ohmic contact with the front electrode 60. The emitter regions 20 make contact with the gate insulating films 42.

The body region 22 is a p-type region, and is provided around the emitter regions 20. The body region 22 includes a body contact region 22a and a low-concentration body region 22b.

The body contact region 22a is a p-type region containing a high concentration of p-type impurities. The body contact region 22a is exposed in the front surface 12a of the semiconductor substrate 12. The body contact region 22a makes ohmic contact with the front electrode 60. The body contact region 22a is adjacent to the emitter regions 20.

The low-concentration body region 22b is a p-type region having a lower p-type impurity concentration than the body contact region 22a. The low-concentration body region 22b is provided under the emitter regions 20 and the body contact region 22a. The low-concentration body region 22b makes contact with the gate insulating films 42 under the emitter regions 20.

The drift region 26 is an n-type region, and is provided under the low-concentration body region 22b. The drift region 26 makes contact with gate insulating films 42 in the vicinities of lower ends of the trenches under the low-concentration body region 22b. The drift region 26 is separated from the emitter regions 20 by the body region 22. An n-type impurity concentration of the drift region 26 is lower than an n-type impurity concentration of the emitter regions 20.

The buffer region 28 is an n-type region containing a high concentration of n-type impurities than the drift region 26. The buffer region 28 is provided under the drift region 26.

The collector region 32 is a p-type region containing a high concentration of p-type impurities. The collector region 32 is provided under the buffer region 28. The collector region 32 is separated from the body region 22 by the drift region 26 and the buffer region 28. The collector region 32 is exposed in the rear surface 12b of the semiconductor substrate 12. The collector region 32 makes ohmic contact with the rear electrode 62.

An IGBT connected between the front electrode 60 and the rear electrode 62 is provided in the device region 16 by the emitter regions 20, the body region 22, the drift region 26, the buffer region 28, the collector region 32, and the gate electrodes 44, etc. That is, the front electrode 60 functions as an emitter electrode, and the rear electrode 62 functions as a collector electrode.

A separating region 70, guard rings 72a to 72d, and termination region 74 are provided in the peripheral region 18.

The separating region 70 is a p-type region, and is provided in a range exposed in the front surface 12a of the semiconductor substrate 12. The separating region 70 is adjacent to the body region 22. The separating region 70 extends from the front surface 12a to a depth that is deeper than a lower end of the body region 22. A lower end of the separating region 70 extends to a depth that is substantially equal to lower ends of the gate electrodes 44. The separating region 70 is connected to the front electrode 60 via the body region 22. As shown in FIG. 3, the separating region 70 extends along a contour of the device region 16. The separating region 70 extends in an annular shape surrounding the device region 16.

As shown in FIGS. 1 and 2, the guard rings 72a to 72d are p-type regions, and are provided in a range exposed in the front surface 12a of the semiconductor substrate 12. Notably, hereinbelow, there are cases where the guard rings 72a to 72d will collectively be called guard rings 72. The guard rings 72 extend from the front surface 12a to a depth that is substantially equal to the lower end of the separating region 70. As shown in FIG. 3, the guard rings 72 extend in an annular shape surrounding the device region 16. More specifically, the guard ring 72a on an innermost side surrounds a periphery of the separating region 70. The guard ring 72b that is second from the inner side surrounds a periphery of the guard ring 72a. The guard ring 72c that is third from the inner side surrounds a periphery of the guard ring 72b. The guard ring 72d on an outermost side surrounds a periphery of the guard ring 72c. As shown in FIGS. 1 and 2, a clearance T1 is provided between the separating region 70 and the guard ring 72a. A clearance T2 is provided between the guard ring 72a and the guard ring 72b. A clearance T3 is provided between the guard ring 72b and the guard ring 72c. A clearance T4 is provided between the guard ring 72c and the guard ring 72d. The clearances T1 to T4 satisfy a relationship of $T1<T2<T3 \leq T4$. Further, the guard rings 72a to 72d have widths W1 to W4 in a direction from the inner side toward the outer side (that is, a direction from the device region 16 toward the end surface 12c). More specifically, the guard ring 72a has the width W1. The guard ring 72b has the width W2. The guard ring 72c has the width W3. The guard ring 72d has the width W4. The widths W1 to W4 satisfy a relationship of $W1>W2>W3>W4$. As shown in FIG. 3, each guard ring 72 includes linear portions extending straight, and corner portions extending in a curve.

The termination region 74 is an n-type region containing a high-concentration of n-type impurities. The n-type impurity concentration of the termination region 74 is higher than the n-type impurity concentration of the drift region 26. As shown in FIG. 1, the termination region 74 is provided in a range exposed in the front surface 12a of the semiconductor substrate 12. Further, the termination region 74 is provided in a range exposed in the end surface 12c of the semiconductor substrate 12. As shown in FIG. 3, the termination region 74 is provided in an annular shape along the end surface 12c of the semiconductor substrate 12. A clearance is provided between the outermost guard ring 72d and the termination region 74.

As shown in FIG. 1, the aforementioned drift region 26, buffer region 28, and collector region 32 are provided across the device region 16 to the peripheral region 18. That is, in the peripheral region 18 as well, regions thereof are laminated in the order of the collector region 32, the buffer region 28, and the drift region 26 from the rear surface 12b side. The drift region 26, the buffer region 28, and the collector region 32 extend to the end surface 12c. The drift region 26 in the peripheral region 18 is provided under the separating region 70, the guard rings 72, and the termination region 74, and makes contact with these regions. Further, the drift region 26 is provided in a clearance between the separating region 70 and the guard ring 72a. The guard ring 72a is separated from the separating region 70 by the drift region 26. Hereinbelow, the drift region 26 between the separating region 70 and the guard ring 72a will be termed a clearance portion 34a. The drift region 26 is provided in clearances between the guard rings 72. The guard rings 72 are separated from each other by the drift region 26. Hereinbelow, the drift region 26 between the guard ring 72a and the guard ring 72b will be termed a clearance portion 34b. Further, the drift region 26 between the guard ring 72b and the guard ring 72c will be termed a clearance portion 34c. Further, the drift region 26 between the guard ring 72c and the guard ring 72d will be termed a clearance portion 34d. Further, hereinbelow, the clearance portions 34a to 34d may in some cases be collectively termed clearance portions 34. The drift region 26 is provided in a clearance between the guard ring 72d and the termination region 74. The termination region 74 is separated from the guard ring 72d by the drift region 26.

A peripheral insulating film 80, first field plates 82a to 82d, second field plates 84, and a termination electrode 86 are provided in the front surface 12a of the semiconductor substrate 12 in the peripheral region 18.

As shown in FIGS. 1 and 2, the termination electrode 86 is provided on the termination region 74. As shown in FIG. 4, the termination electrode 86 is provided in an annular shape along the termination region 74. The termination electrode 86 makes ohmic contact with the termination region 74.

As shown in FIGS. 1 and 2, the peripheral insulating film 80 covers an entirety of the front surface 12a in the peripheral region 18 except for the termination electrode 86 and contact holes to be described later.

The first field plates 82a to 82d are provided inside the peripheral insulating film 80. Hereinbelow, within the peripheral insulating film 80, in some cases a portion located lower than the first field plates 82a to 82d will be termed a first peripheral insulating film 80a, and the other part (part covering the first field plates 82a to 82d) will be termed a second peripheral insulating film 80b. Further, hereinbelow, the first field plates 82a to 82d may in some cases be collectively termed first field plates 82.

The first field plates 82 are configured of conductive polysilicon. The first field plates 82 are each arranged above their corresponding guard rings 72. That is, the first field plate 82a is arranged above the guard ring 72a. The first field plate 82b is arranged above the guard ring 72b. The first field plate 82c is arranged above the guard ring 72c. The first field plate 82d is arranged above the guard ring 72d. As shown in FIG. 4, the first field plates 82 each extend in an annular shape along their corresponding guard rings 72 (that is, the guard ring 72 located thereunder). Each first field plate 82 includes linear portions extending straight, and corner portions extending in a curve. Widths of the first field plates 82 are wider than the widths of the guard rings 72 thereunder. Thus, when the semiconductor substrate 12 is seen in the plan view, the entirety of each guard ring 72 overlaps with the corresponding first field plate 82 thereabove. As shown in FIGS. 1 and 2, the first peripheral insulating film 80a is arranged under all of the first field plates 82. The first field plates 82 are provided with clearances in between them. The peripheral insulating film 80 is provided in the clearances between the first field plates 82. The first field plates 82 are insulated from one another by the peripheral insulating film 80. An upper surface of the first field plate 82a is covered by the second peripheral insulating film 80b.

The second field plates 84 are configured of metal. The second field plates 84 are provided on the second peripheral insulating film 80b. A thickness of the second field plates 84 is thicker than a thickness of the first field plates 82. As shown in FIG. 4, the second field plates 84 are provided locally above the first field plates 82. That is, the second field plates 84 are provided so that they overlap with parts of the first field plates 82 in a circumferential direction. A plurality of second field plates 84 is provided above one first field plate 82. The second field plates 84 are provided above the linear portions of each first field plate 82. That is, the second field plates 84 are provided above the linear portions of each guard ring 72. The second field plates 84 are not provided above the corner portions of each first field plate 82. That is, the second field plates 84 are not provided above the corner portions of each guard ring 72. The second field plates 84 above one first field plate 82 are provided at positions shifted in a longitudinal direction (direction along which the first field plate 82 extends) relative to each of the second field plates on adjacent first field plates 82. For example, the second field plates 84 above the first field plate 82b are arranged at positions displaced in the direction along which the first field plate 82b extends relative to the second field plates 84 of the adjacent first field plates 82a, 82c. Due to this, wide clearances can be ensured between the second field plates 84.

FIG. 5 shows an enlarged plan view of one second field plate 84. Further, FIG. 6 shows a cross sectional view of a periphery of the second field plate 84 along a line VI-VI in FIG. 5, and FIG. 7 shows a cross sectional view of a periphery of the second field plate 84 along a line VII-VII in FIG. 5. Notably, in FIGS. 5 to 7, the second field plate 84 arranged above the guard ring 72a is shown as the example, however, all of the second field plates 84 have the structure described hereinbelow. As shown in FIGS. 5 and 6, a contact hole 90 is provided under the second field plate 84. More specifically, a through hole 83 is provided in the first field plate 82 positioned under the second field plate 84. The through hole 83 pierces through the second field plate 84 from a front surface to a rear surface thereof. The contact hole 90 pierces through the peripheral insulating film 80 from a front surface to a rear surface thereof by passing through the through hole 83. The contact hole 90 is configured of the same metal as the second field plate 84. The contact hole 90 connects the second field plate 84 to the guard ring 72 that is located underneath. The peripheral insulating film 80 is provided between the contact hole 90 and the first field plate 82 (that is, between the contact hole 90 and an inner surface of the through hole 83). A center line C1 in FIGS. 5 to 7 indicates a center line of the guard ring 72 in a direction from the inner side toward the outer side (that is, the width direction of the guard ring 72). As shown in FIGS. 5 and 6, an entirety of the contact hole 90 is provided on the inner side than the center line C1. That is, the contact hole 90 is connected to a portion of the guard ring 72 that is located on the inner side than the center line C1.

As shown in FIGS. 5 and 7, a contact hole 92 is provided under the second field plate 84. The contact hole 92 is provided at a position different from the contact hole 90. The contact hole 92 is configured of the same metal as the second field plate 84. The contact hole 92 pierces through the second peripheral insulating film 80b from a front surface to a rear surface thereof. The contact hole 92 connects the second field plate 84 to the first field plate 82 that is located underneath. Thus, the first field plate 82 is connected to the guard ring 72 via the contact hole 92, the second field plate 84, and the contact hole 90. As shown in FIGS. 5 and 7, an entirety of the contact hole 92 is provided on the inner side than the center line C1. That is, the contact hole 92 is connected to a portion of the first field plate 82 that is located on the inner side than the center line C1.

Next, an operation of the semiconductor apparatus 10 will be described. When a potential that is equal to or greater than a threshold is applied to the gate electrodes 44, channels are formed in the body region 22 in ranges adjacent to the gate insulating films 42. When the rear electrode 62 comes to have a higher potential than the front electrode 60 in the state where the channels are formed, the IGBT turns ON, and current flows from the rear electrode 62 to the front electrode 60.

The channels disappear by reducing the potential of the gate electrodes 44, as a result of which the IGBT turns OFF. In so doing, a reverse voltage is applied to pn junctions at interfaces between the p-type regions, including the body region 22 and the separating region 70, and the drift region 26. Due to this, a depletion layer extends from the body region 22 and the separating region 70 into the drift region 26. In the peripheral region 18, the depletion layer extends from the separating region 70 toward the outer side. When the depletion layer extending from the separating region 70 reaches the guard ring 72a, the depletion layer further extends toward the outer side through the guard rings 72a to 72d. Due to this, the depletion layer extends to the vicinity of the termination region 74. That is, the drift region 26 around the separating region 70 and the guard rings 72 is depleted. The insulating performance of the separating region 70 is ensured by the depleted drift region 26. In a state where the IGBT is OFF, a potential of the termination region 74 becomes substantially equal to the potential of the rear electrode 62. Due to this, the peripheral region 18 is applied with an electric field in a lateral direction (direction extending from the termination region 74 to the separating region 70). This electric field is applied primarily to the depleted drift region 26. In the semiconductor apparatus 10 of the present embodiment, a structure is provided for alleviating the electric field applied to the depleted drift region 26. Hereinbelow, this will be described in detail.

Figure 8:
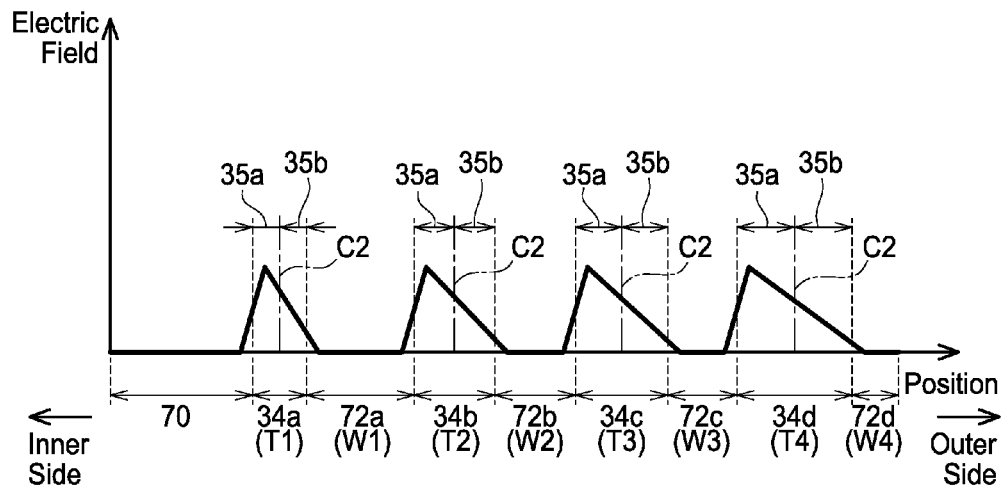
FIG. 8 is a graph showing an electric field distribution in a peripheral region 18 of the semiconductor apparatus of the embodiment.

FIG. 8 shows an electric field distribution in the vicinity of the front surface 12a in the peripheral region 18 of the semiconductor apparatus 10 when the IGBT is OFF. As shown in FIG. 8, when the IGBT turns OFF, the electric field is generated in the depleted drift region 26 (that is, in the clearance portions 34) between the separating region 70 and the guard rings 72. A peak value of the electric field in the clearance portions 34 is generated in a region on the inner side than a center portion C2 of each clearance portion 34 in the width direction. That is, in each clearance portion 34, the electric field is higher in a region 35a on the inner side than the center portion C2 than in a region 35b on the outer side of the center portion C2. In other words, in the regions 35b that are adjacent to the guard rings 72 on the inner side have lower electric field than the regions 35a that are adjacent to the guard rings 72 on the outer side.

As described above, the contact hole 90 makes contact with its corresponding guard ring 72. Since the contact holes 90 are provided locally, there may be cases where the electric field in the drift region 26 (that is, the clearance portion 34) surrounding the contact holes 90 may be disturbed by the contact holes 90. If the electric field is disturbed in a region where a high electric field is being generated, even a higher electric fields will be generated by the electric field concentrating to one part within such a region. However, in the semiconductor apparatus 10 of the present embodiment, the contact holes 90 make contact with the corresponding guard ring 72 on the inner side than the center line C1 of this guard ring 72. Due to this, although the region 35b in contact with this guard ring 72 on the inner side within the clearance portion 34 will be affected by the contact hole 90, but the region 35a in contact with this guard ring 72 on the outer side hardly receives any influence of the contact holes 90. Since the electric field in the region 35a where the high electric field is being generated is avoided from being disturbed by the contact holes 90, so the generation of an even higher electric field at a part of the region 35a is suppressed. Further, although the electric field concentration is likely to occur in the region 35b by the influence of the contact holes 90, however, since the electric field in the region 35b is not so large, so a prominently high electric field will not be generated even if electric field concentration occurs therein. Accordingly, by making the contact hole 90 to make contact with the corresponding guard ring 72 on the inner side than the center line 1 thereof, the generation of the high electric fields in the peripheral region 18 is suppressed.

Figure 9:
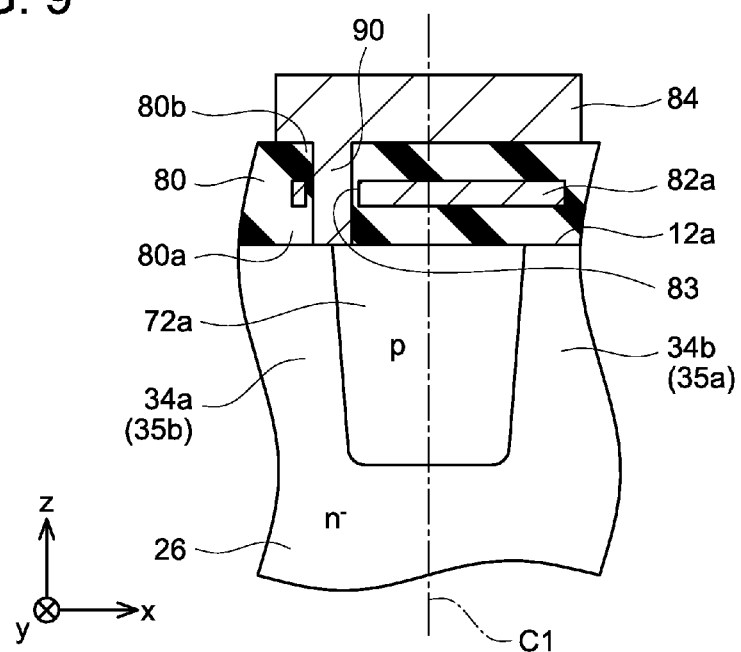
FIG. 9 is a vertical cross sectional view showing a positional displacement of a contact hole 90.

Further, as shown in FIG. 9, there are cases where the contact holes 90 are located on the inner side of the guard rings 72 by manufacturing error. As such, if the positions of the contact holes 90 are displaced, the electric field is concentrated in the vicinity of contact interfaces between the contact holes 90 and the clearance portions 34. However, as mentioned above, since the electric field generated in the regions 35b adjacent to the guard rings 72 on the inner side is small, so a prominently high electric field will not be generated even if electric field concentration occurs therein. As above, according to this structure, the high electric field is less likely to be generated in the peripheral region 18 even in the case where the positional displacement of the contact holes 90 is generated due to the manufacturing error.

Further, in the clearance portions 34 in the vicinity of the corner portions of the guard rings 72, a higher electric field is generated than in the clearance portions 34 in the vicinity of the linear portions. In the semiconductor apparatus 10, the second field plates 84 are not provided above the corner portions of the guard rings 72. That is, no contact hole is provided above the corner portions of the guard rings 72. Due to this, the electric field in the clearance portions 34 in the vicinity of the corner portions of the guard rings 72 is prevented from being disturbed by contact holes. Due to this, the generation of the high electric field in the vicinity of the corner portions can be suppressed.

Notably, as described above, the guard rings 72 on the outer side have narrower widths. Due to this, it is difficult to form contact holes 90 contacting the guard rings 72 on the outer side with narrower widths (for example, the guard ring 72d), and the positions of the contact holes 90 are more likely to be displaced relative to the guard ring 72. However, by intentionally displacing the contact holes 90 to the inner side relative to the center line of each guard ring 72 in the width direction as described above, the generation of the high electric field in regions adjacent to the guard rings 72 on the outer side can be suppressed even in cases where the positional displacement of the contact holes 90 occurs. That is, the structure that displaces the contact holes 90 to the inner side is especially effective for guard rings with narrow widths, such as the guard ring 72d on the outer side.

Figure 10:
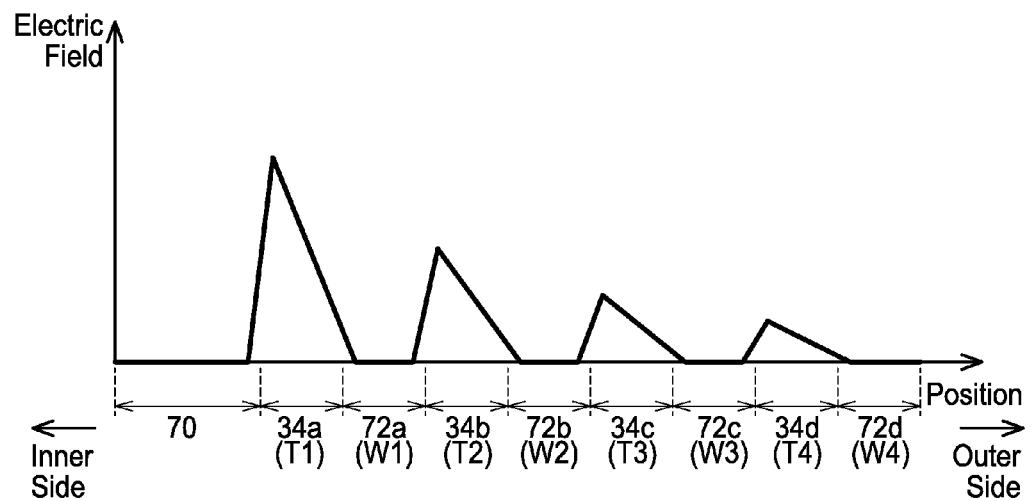
FIG. 10 is a graph showing an electric field distribution in a peripheral region 18 of a semiconductor apparatus of a comparative example.

Further, FIG. 10 shows an electric field distribution of a semiconductor apparatus of a comparative example corresponding to FIG. 8. As described above, in the semiconductor apparatus 10 of the present embodiment, the clearances T1 to T4 satisfy the relationship of T1<T2<T3<T4, and the widths W1 to W4 satisfy the relationship of W1>W2>W3>W4. On the other hand, in the semiconductor apparatus of the comparative example, clearances T1 to T4 are substantially equal, and widths W1 to W4 are substantially equal. Other configurations of the semiconductor apparatus of the comparative example are substantially equal to those of the semiconductor apparatus 10 of the present embodiment.

As shown in FIG. 10, in the case where the clearances T1 to T4 are equal and the widths W1 to W4 are equal, higher electric fields are generated in the clearance portions 34 on the inner side. Especially, the high electric field is likely to occur in the clearance portion 34a between the separating region 70 and the guard ring 72a.

With respect to this, in FIG. 8, the relationship of T1<T2<T3<T4 is satisfied. If the clearance is made narrower, the electric field generated in this clearance portion 34 becomes smaller. In the semiconductor apparatus 10 of the present embodiment, the electric field is suppressed greater for clearance portions 34 on the inner side, since the relationship of T1<T2<T3<T4 is satisfied. Especially, since the clearance T1 is the smallest, the electric field generated in the clearance portion 34a having the clearance T1 is especially suppressed.

Further, in FIG. 8, the relationship of W1>W2>W3>W4 is satisfied. If the width of a guard ring 72 is made narrower, the electric field generated in a clearance portion 34 adjacent to this guard ring 72 on the inner side becomes smaller. In the semiconductor apparatus 10 of the present embodiment, the electric field is suppressed greater for clearance portions 34 on the inner side, since the relationship of W1>W2>W3>W4 is satisfied. Especially, since the width W1 of the guard ring 72a is the smallest, the electric field generated in the clearance portion 34a adjacent to the guard ring 72a on the inner side is especially suppressed.

As described above, contrary to the fact that higher electric fields are generated in the clearance portions 34 on the inner side in the semiconductor apparatus of the comparative example in which the clearances T1 to T4 are substantially equal and the widths W1 to W4 are substantially equal, in the semiconductor apparatus 10 of the present embodiment, the clearances T1 to T4 and the widths W1 to W4 are adjusted so that the electric field is suppressed at greater degree for the clearance portions 34 on the inner side. Due to this, as shown in FIG. 8, in the semiconductor apparatus 10 of the present embodiment, the peak values of the electric fields generated in the clearance portions 34 become uniform, as compared to those in FIG. 10. That is, the electric fields can be distributed evenly in the peripheral region 18. By distributing the electric fields evenly as above, the maximum value of the electric fields generated in the peripheral region 18 becomes smaller. Due to this, the semiconductor apparatus 10 of the present embodiment has a high voltage resistance.

Further, there are cases where charges present on the outside adhere to the front surface of the semiconductor apparatus 10. If the electric field in the peripheral region 18 is disturbed by such external charges, a high electric field may be generated locally within the peripheral region 18. However, in the semiconductor apparatus 10 of the present embodiment, the first field plates 82 are arranged above the front surface of the peripheral region 18. The electric fields generated by the external charges are avoided from influencing the electric field in the peripheral region 18 by a shielding effect of the first field plates 82. Especially, in the semiconductor apparatus 10 of the present embodiment, since a thickness of the first field plates 82 is thin, clearances between the first field plates 82 are small. That is, the first field plates 82 are arranged at high density. Due to this, even a higher shielding effect can be achieved.

Further, the second field plates 84 have a thick thickness, and have low workability. Due to this, upon processing the second field plates 84 by etching, large clearances need to be provided between the second field plates 84. In the semiconductor apparatus 10 of the present embodiment, since the second field plates 84 are provided only at parts of the first field plates 82, the second field plates 84 can be arranged by dispersing them over the semiconductor substrate 12. Due to this, even if the first field plates 82 are arranged at high density, the second field plates 84 do not interfere with each other, and the second field plates 84 can be arranged with sufficient clearances. Further, the first field plates 82 can be connected to the guard rings 72 via the second field plates 84, so the potential of the first field plates 82 can thereby be stabilized.

Further, by arranging the first field plates 82 at high density as above, the width of the peripheral region 18 can be made smaller. Due to this, the size of the semiconductor apparatus 10 can be made compact.

Next, a manufacturing method of the semiconductor apparatus 10 will be described. Notably, the manufacturing method is characteristic in the formation of conducting films and insulating films on the peripheral region 18, so processes thereof will only be described.

The first peripheral insulating film 80a is formed on the front surface 12a in the peripheral region 18 after having formed the p-type regions and the n-type regions in the semiconductor substrate 12. Then, a polysilicon layer with a thin thickness is formed on the first peripheral insulating film 80a. Then, the polysilicon layer is selectively etched to form a pattern of the first field plates 82. Due to this, the first field plates 82 are formed. Since the thickness of the polysilicon layer is thin, the polysilicon layer can be processed highly accurately by the etching. Due to this, the plurality of first field plates 82 can be formed at high density. Next, the second peripheral insulating film 80b is formed on the first field plates 82. Next, through holes corresponding to the contact holes 90 and through holes corresponding to the contact holes 92 are formed in the peripheral insulating film 80. Then, the contact holes 90, 92 are formed by growing metal in each of the through holes. At this occasion, a metal film is grown also on the second peripheral insulating film 80b. Further, a metal layer grows on the front surface 12a of the semiconductor substrate 12 in the device region 16. Here, the metal film is grown thick. Then, the metal layer is selectively etched to form a pattern of the second field plates 84. Due to this, the second field plates 84 are formed. Further, the front electrode 60 is formed by separating the metal film in the device region 16 from the second field plates 84. Since the thickness of the metal layer is thick, it is difficult to highly accurately process the metal film. However, since the second field plates 84 are formed locally on the first field plates 82, the second field plates 84 can be arranged by dispersing them. Due to this, sufficient clearances can be provided between the second field plates 84. According to the above processes, the structure on the front surface 12a side of the semiconductor apparatus 10 is completed. Thereafter, the semiconductor apparatus 10 is completed by forming the structure on the rear surface 12b side.

Next, a relationship of the constituent features of the aforementioned embodiment and the constituent features of the claims will be described. The first field plates of the embodiment are an example of first peripheral conducting films in the claims. The second field plates of the embodiment are an example of a second peripheral conducting film in the claims. The IGBT of the embodiment is an example of a semiconductor device in the claims. The contact holes 92 of the embodiment are an example of a first contact hole in the claims. The contact holes 90 of the embodiment are an example of a second contact hole in the claims. The p-type regions including the body region 22 and the separating region 70 of the embodiment are an example of a main region in the claims. The guard ring 72a of the embodiment is an example of a guard ring located on an innermost side in the claims.

Figure 11:
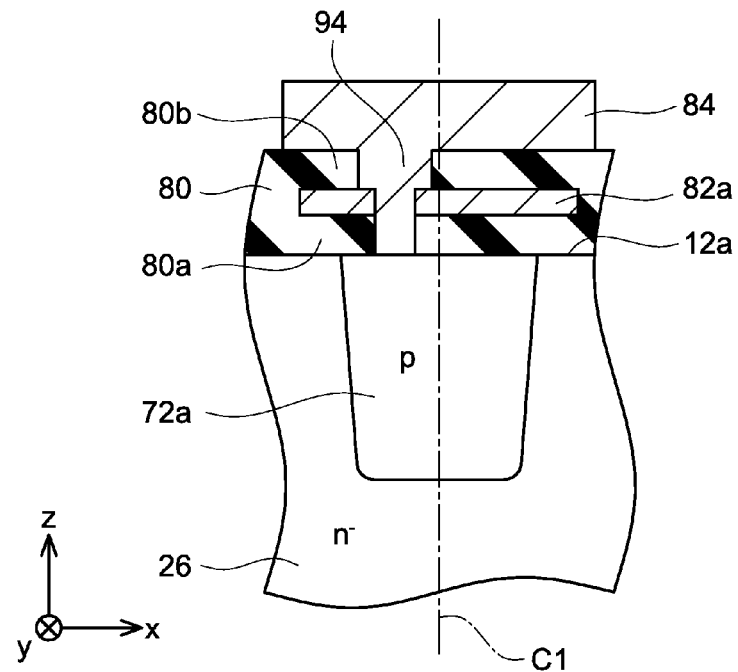
FIG. 11 is a vertical cross sectional view showing a contact hole 94 of a variant.

Notably, in the above embodiment, the contact holes 90 for connecting the second field plates 84 and the guard rings 72 and the contact holes 92 for connecting the first field plates 82 and the second field plates 84 were formed separately. However, as shown in FIG. 11, the guard ring 72, the first field plate 82, and the second field plate 84 may be connected to each other by one contact hole 94. In this case, the contact hole 94 functions as both the first contact hole and the second contact hole in the claims.

Figure 12:
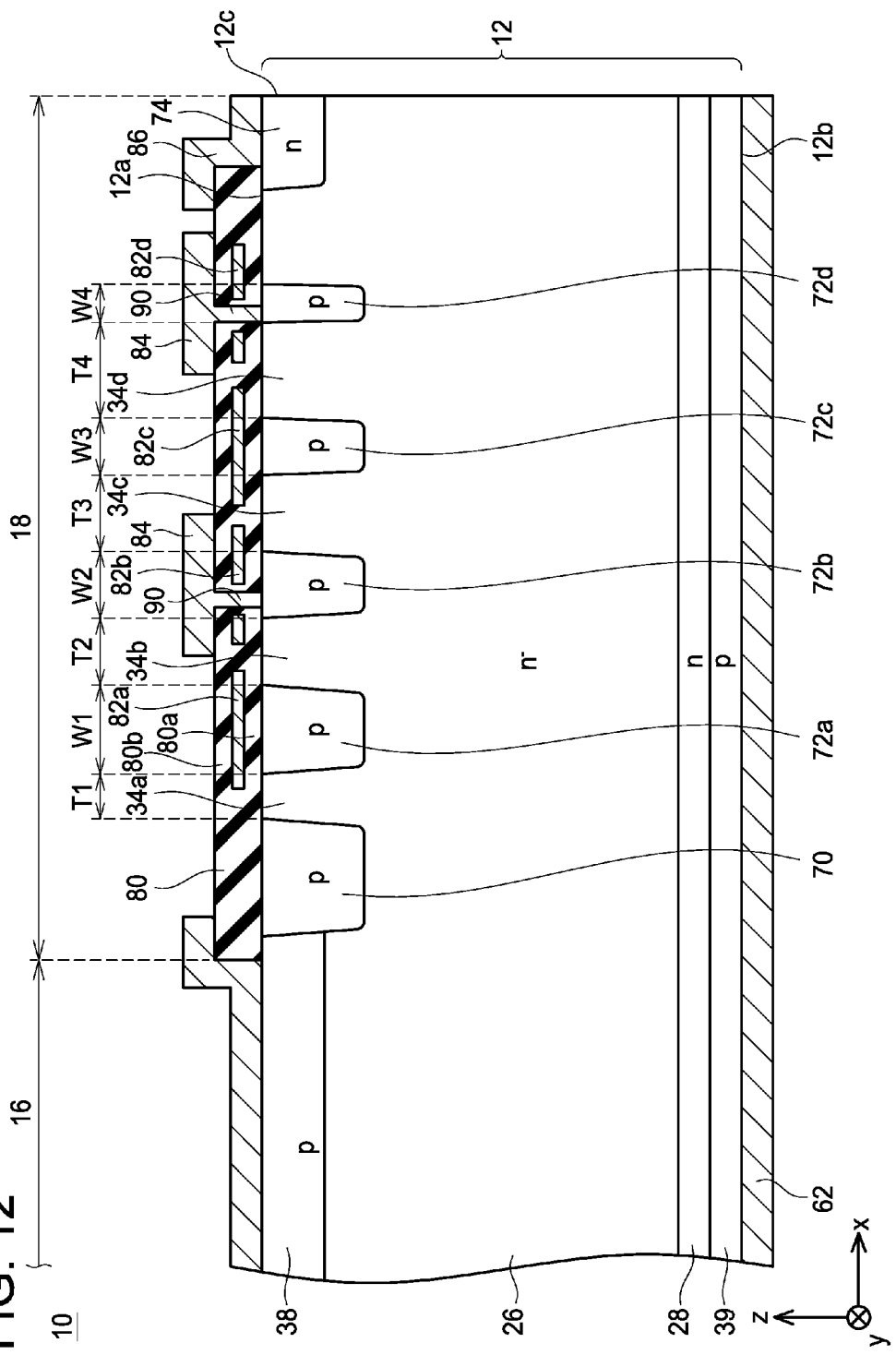
FIG. 12 is a vertical cross sectional view showing a semiconductor apparatus of a variant.

Further, in the above embodiment, the IGBT was formed in the device region 16, however, instead of the IGBT, a MOSFET may be formed therein. The MOSFET can be formed in the device region 16 by forming an n-type region (drain region) contacting the rear electrode 62 with high n-type impurity concentration instead of the collector region 32. Further, as shown in FIG. 12, a diode may be formed in the device region 16. In the structure of FIG. 12, a p-type anode region 38 contacting the front electrode 60 is formed on the front surface side of the drift region 26 in the device region 16. Further, an n-type cathode region 39 with high concentration and making contact with the rear electrode 62 is formed on the rear surface side of the buffer region 28. Even in the case of forming the diode as in FIG. 12, the depletion layer extends in the peripheral region 18 when the reverse voltage is applied to the diode. Due to this, the electric field in the peripheral region 18 is suppressed similar to the aforementioned embodiment. Further, a plurality of semiconductor devices of different types may be formed in the device region 16.

Figure 13:
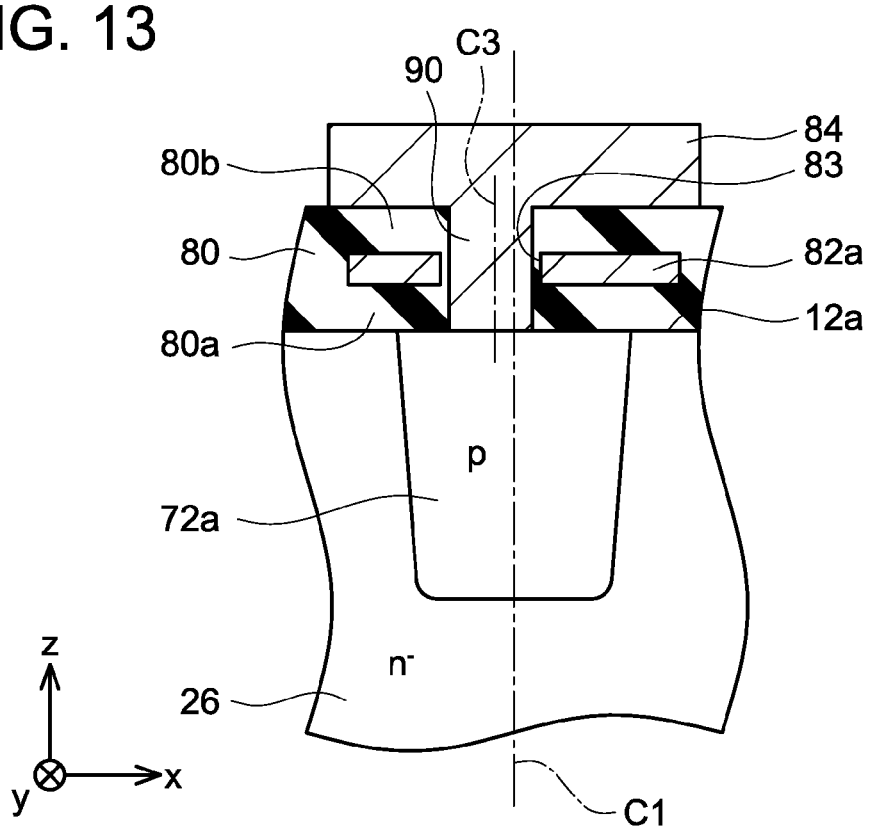
FIG. 13 is a vertical cross sectional view showing a contact hole 90 of a variant.

Further, in the above embodiment, the entireties of the contact holes 90 are positioned on the inner side than the center lines C1 of the guard rings 72 in the width direction. However, as shown in FIG. 13, a part of each contact hole 90 may be projecting to the outer side than the center line C1. So long as a center C3 of the contact hole 90 is positioned on the inner side than the center line C1, the part of the contact hole 90 may be positioned on the outer side than the center line C1. Even by such a configuration, the disturbances in the electric field in the region adjacent to each guard ring 72 on its outer side can be suppressed.

Figure 14:
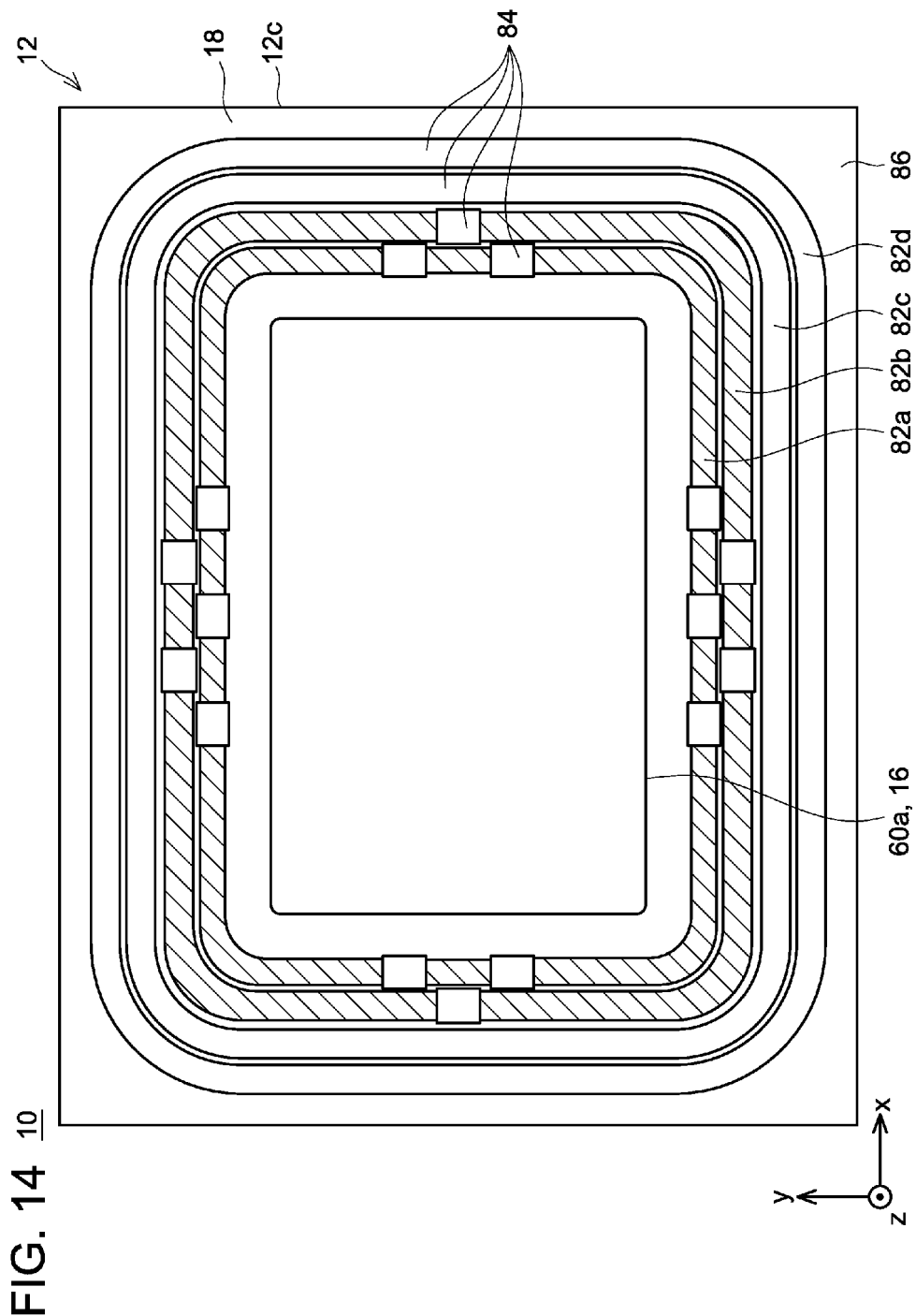
FIG. 14 is a plan view corresponding to FIG. 4 showing a semiconductor apparatus of a variant.

Further, in the above embodiment, the second field plates 84 are formed in an island shape on all of the guard rings 72. However, as shown in FIG. 14, a second field plate 84 extending in an annular shape along its corresponding guard ring 72 may be provided on one or more of the guard rings 72. Although not shown in FIG. 14, the contact holes 90, 92 are formed under the annular second field plates 84. In this case also, it is preferable that the centers of the contact holes 90 under the annular second field plate 84 are located on the inner side than the center line C1 of the corresponding guard ring 72.

Some of the technical elements disclosed herein will be listed below. Notably, the technical elements hereinbelow are each independently useful.

In an example of the semiconductor apparatus disclosed herein, each of the guard rings may comprise a linear portion extending straight in the plan view along the thickness direction and a corner portion extending in a curve in the plan view along the thickness direction. In this occasion, the second contact holes may be located in positions overlapping the linear portions in the plan view along the thickness direction and may not be located in positions overlapping the corner portions in the plan view along the thickness direction.

According to this configuration, since the drift region in the vicinity of the corner portions where the high electric field is likely to be generated does not receive the influence of the second contact hole, the high electric field can be suppressed from generating in the vicinity of the corner portions.

In an example of the semiconductor apparatus disclosed herein, the semiconductor substrate may comprise a main region of the p-type, that is in contact with the front electrode, and is separated from each of the guard rings by the drift region. In this occasion, a clearance between the main region and the guard ring located on an innermost side is preferably smaller than each clearance between adjacent guard rings.

According to this configuration, the electric field distribution in the peripheral region can further be made uniform.

In an example of the semiconductor apparatus disclosed herein, among clearances between adjacent guard rings, each clearance increases as it is positioned on an outer side.

According to this configuration, the electric field distribution in the peripheral region can further be made uniform.

In an example of the semiconductor apparatus disclosed herein, among widths of the guard rings, each width may increase as the guard ring is positioned on an outer side.

According to this configuration, the electric field distribution in the peripheral region can further be made uniform.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:
1. A semiconductor apparatus, comprising:
a semiconductor substrate;
a front electrode being in contact with a front surface of the semiconductor substrate;
a rear electrode being in contact with a rear surface of the semiconductor substrate;
a first peripheral insulating film;
a plurality of first peripheral conducting films;
a second peripheral insulating film; and
a plurality of second peripheral conducting films,
wherein
the semiconductor substrate comprises a device region and a peripheral region,
in a plan view along a thickness direction of the semiconductor substrate, the device region overlaps a contact face between the front electrode and the semiconductor substrate, and the peripheral region is located around the device region,
the device region comprises a semiconductor device being configured to pass electric current between the front electrode and the rear electrode,
the peripheral region comprises:
a plurality of guard rings being of a p-type, exposed in the front surface, and having an annular shape surrounding the device region; and
a drift region being of an n-type and separating the guard rings from each other,
the first peripheral insulating film is located on the front surface in the peripheral region,
each of the first peripheral conducting films is located on the first peripheral insulating film, and having an annular shape overlapping the corresponding guard ring in the plan view along the thickness direction, the second peripheral insulating film is located on each of the first peripheral conducting films, each of the second peripheral conducting films is located on the second peripheral insulating film, located so as to overlap a part of the corresponding first peripheral conducting film in the plan view along the thickness direction, and has a thickness greater than a thickness of each of the first peripheral conducting films, each of the second peripheral conducting films is connected to the corresponding first peripheral conducting film via a first contact hole, each of the second peripheral conducting films is connected to the corresponding guard ring via a second contact hole, and a center of at least one of the second contact holes is located on an inner side with respect to a center line of the guard ring connected to the at least one second contact hole, the center line defining a center of the guard ring in a width direction.

2. The semiconductor apparatus of claim 1, wherein each of the guard rings comprises a linear portion extending straight in the plan view along the thickness direction and a corner portion extending in a curve in the plan view along the thickness direction, and the second contact holes are located in positions overlapping the linear portions in the plan view along the thickness direction and are not located in positions overlapping the corner portions in the plan view along the thickness direction.

3. The semiconductor apparatus of claim 1, wherein the semiconductor substrate comprises a main region being of the p-type, being in contact with the front electrode, and separated from each of the guard rings by the drift region, and a clearance between the main region and the guard ring located on an innermost side is smaller than each clearance between adjacent guard rings.

4. The semiconductor apparatus of claim 1, wherein, among clearances between adjacent guard rings, each clearance increases as it is positioned on an outer side.

5. The semiconductor apparatus of claim 1, wherein among widths of the guard rings, each width increases as it is positioned on an outer side.

* * * * *